United States Patent
Zhou et al.

(10) Patent No.: US 9,712,198 B1
(45) Date of Patent: Jul. 18, 2017

(54) APPARATUS AND METHOD FOR PROVIDING BACKGROUND REAL-TIME SECOND ORDER INPUT INTERCEPT POINT CALIBRATION

(71) Applicant: Samsung Electronics Co., Ltd., Gyeonggi-do (KR)

(72) Inventors: Quan Zhou, Sunnyvale, CA (US); Zhiyu Yang, Dublin, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/156,986

(22) Filed: May 17, 2016

Related U.S. Application Data (60) Provisional application No. 62/310,174, filed on Mar. 18, 2016.

(51) Int. Cl.
*H04B 1/40* (2015.01)
*H04B 17/00* (2015.01)
(Continued)

(52) U.S. Cl.
CPC ............ *H04B 1/109* (2013.01); *H03D 7/165* (2013.01); *H04B 1/1036* (2013.01); *H04B 1/30* (2013.01);
(Continued)

(58) Field of Classification Search
CPC ... H04B 1/10; H04B 1/12; H04B 1/16; H04B 1/40; H04B 1/54; H04B 1/109;
(Continued)

(56) References Cited

U.S. PATENT DOCUMENTS 7,130,579 B1 * 10/2006 Rael ................. H03B 21/01
455/118
7,773,967 B2    8/2010 Smith
(Continued)

FOREIGN PATENT DOCUMENTS

KR    10-0598372    6/2006

OTHER PUBLICATIONS

Dufrene, K., et al., Digital adaptive iip2 calibration scheme for cmos downconversion mixers IEEE Journal of Solid-State Circuits, pp. 2434-2445, vol. 43, No. 11, Nov. 2008.
(Continued)

*Primary Examiner* — Quochien B Vuong
(74) *Attorney, Agent, or Firm* — The Farrell Law Firm, P.C.

(57) ABSTRACT

An apparatus and method. The method includes filtering an output of an in-phase (I-mixer); filtering an output of a quadrature-mixer (Q-mixer); converting an output of a first low pass filter (LPF); converting an output of a second LPF; buffering an output of a first analog-to-digital converter (ADC); buffering an output of a second ADC; buffering a transmitter signal; generating a reference signal from an output of a transmitter (TX) data capture buffer; removing DC from the reference signal; and adaptively tuning an I-mixer digital-to-analog (DAC) code and a Q-mixer DAC code from an output of a first receiver (RX) data capture buffer, an output of a second RX data capture buffer, an output of a DC removal unit, and a predetermined step size for each of the I-mixer DAC code and the Q-mixer DAC code.

20 Claims, 6 Drawing Sheets

(51) Int. Cl.
*H04W 24/00* (2009.01)
*H04B 1/10* (2006.01)
*H03D 7/16* (2006.01)
*H04B 17/21* (2015.01)
*H04B 1/30* (2006.01)

(52) U.S. Cl.
CPC ............. *H04B 1/40* (2013.01); *H04B 17/21* (2015.01); *H03D 2200/005* (2013.01); *H03D 2200/0052* (2013.01); *H03D 2200/0066* (2013.01); *H03D 2200/0082* (2013.01)

(58) Field of Classification Search
CPC ........ H04B 1/123; H04B 17/00; H04B 17/21; H04B 17/29; H04B 17/345; H04B 2001/305; H04W 24/02; H04L 25/0296; H04L 25/03006; H04L 27/3863
USPC ........... 455/63.1, 67.11, 67.13, 77, 118, 318, 455/323, 423, 425; 375/219, 224
See application file for complete search history.

(56) References Cited

U.S. PATENT DOCUMENTS

| | | | |
|---|---|---|---|
| 8,000,676 B2 | 8/2011 | Kim et al. | |
| 8,010,074 B2 | 8/2011 | Kaczman et al. | |
| 8,060,043 B2* | 11/2011 | Pratt ...................... | H04B 17/21 375/345 |
| 8,073,078 B2 | 12/2011 | Kaczman et al. | |
| 8,121,571 B2 | 2/2012 | Kushnir et al. | |
| 8,150,350 B2 | 4/2012 | Pratt et al. | |
| 8,718,574 B2 | 5/2014 | Panikkath et al. | |
| 8,774,747 B2 | 7/2014 | Hyun et al. | |
| 8,787,864 B2* | 7/2014 | Leung ................... | H03D 7/165 455/323 |
| 9,002,310 B2* | 4/2015 | Dufrêne et al. ....... | H03D 7/165 455/295 |
| 9,065,537 B2 | 6/2015 | Georgantas et al. | |
| 9,178,559 B2 | 11/2015 | Aoulad Ali et al. | |
| 9,197,279 B2 | 11/2015 | Manku | |
| 9,444,559 B2* | 9/2016 | Jiang ..................... | H04B 17/00 |
| 2007/0173220 A1 | 7/2007 | Kim et al. | |
| 2014/0226759 A1 | 8/2014 | Han et al. | |
| 2014/0355456 A1 | 12/2014 | Jiang et al. | |
| 2015/0256214 A1* | 9/2015 | Lee ........................ | H04B 17/14 455/83 |
| 2015/0333850 A1 | 11/2015 | Myoung et al. | |

OTHER PUBLICATIONS

Zhijian Lu et al., Adaptive calibration of iip2 in direct downconversion mixers with modified lms algorithm Circuits and Systems (ISCAS), 2011 IEEE International Symposium, Date of Conference: May 15-18, 2011, pp. 542-545 ISSN : 0271-4302 E-ISBN : 978-1-4244-9472-9 Print ISBN: 978-1-4244-9474-3-11 INSPEC Accession No. 12522938.

Peichen Jiang et al., All-Digital Adaptive Module for Automatic Background IIP2 Calibration in CMOS Downconverters With Fast Convergence, IEEE Transactions on Circuit and Systems, vol. 60, No. 7, Jul. 2013, pp. 427-431.

* cited by examiner

APPARATUS AND METHOD FOR PROVIDING BACKGROUND REAL-TIME SECOND ORDER INPUT INTERCEPT POINT CALIBRATION

PRIORITY

This application claims priority under 35 U.S.C. §119(e) to a U.S. Provisional Patent Application filed on Mar. 18, 2016 in the United States Patent and Trademark Office and assigned Ser. No. 62/310,174, the entire contents of which are incorporated herein by reference.

FIELD

The present disclosure relates generally to an apparatus and a method for providing second order intercept point (IIP2) calibration, and more particularly, to an apparatus and a method for providing background real-time IIP2 calibration.

BACKGROUND

IIP2 calibration is a stringent requirement for a cellular frequency division duplex (FDD) system due to finite isolation between a transmitter and a receiver. Due to a strong dependency between an in-phase path (I-path) and a quadrature-phase path (Q-path) during IIP2 calibration, an exhaustive search to find an optimal digital-to-analog converter (DAC) code that minimizes the I-path and Q-path second order intermodulation (IM2) tone amplitude simultaneously is frequently performed. An exhaustive search may be time consuming. Alternatively, an iterative search may be performed. However, an iterative search method suffers from a convergence issue within a few iterations due to IQ path dependency.

An initial optimal mixer DAC code may be preset during factory calibration. Due to process and/or temperature variation, an actual real-time optimal mixer DAC code may deviate from the initial preset mixer DAC code.

SUMMARY

According to one embodiment, an apparatus includes a first low pass filter (LPF), including an input connected to an output of an in-phase mixer (I-mixer), and an output; a second LPF, including an input connected to an output of a quadrature-mixer (Q-mixer), and an output; a first analog-to-digital converter (ADC), including a first input connected to the output of the first LPF, and an output; a second ADC, including a first input connected to the output of the second LPF, and an output; a first receiver (RX) data capture buffer, including an input connected to the output of the first ADC, and an output; a second RX data capture buffer, including an input connected to the output of the second ADC, and an output; a direct current (DC) removal unit, including a first input connected to the output of the first RX data capture buffer, a second input connected to the output of the second RX data capture buffer, a first output, and a second output; an adaptive tuning module unit, including a first input connected to the first output of the DC removal unit, a second input connected to the second output of the DC removal unit, a third input, a fourth input for receiving a predetermined step size for each of the I-mixer and the Q-mixer, a first output connected to a second input of the I-mixer, and a second output connected to a second input of the Q-mixer; a transmitter (TX) data capture buffer, including an input, and an output; and a reference generator, including an input connected to the output of the TX data capture buffer, and an output connected to the third input of the adaptive tuning module.

According to one embodiment, an apparatus includes a first LPF, including an input connected to an output of an in-phase (I-mixer), and an output; a second LPF, including an input connected to an output of a quadrature-phase mixer (Q-mixer), and an output; a first ADC, including a first input connected to the output of the first LPF, and an output; a second ADC, including a first input connected to the output of the second LPF, and an output; a first RX data capture buffer, including an input connected to the output of the first ADC, and an output; a second RX data capture buffer, including an input connected to the output of the second ADC, and an output; an adaptive tuning module unit, including a first input connected to the output of the first RX data capture buffer, a second input connected to the output of the second RX data capture buffer, a third input, a fourth input for receiving a predetermined step size for each of the I-mixer and the Q-mixer, a first output connected to a second input of the I-mixer, and a second output connected to a second input of the Q-mixer; a transmitter (TX) data capture buffer, including an input, and an output; a reference generator, including an input connected to the output of the TX data capture buffer, and an output; and a DC removal unit, including an input connected to the output of the reference generator, and an output connected to the third input of the adaptive tuning module.

According to one embodiment, a method includes filtering, by a first LPF, an output of an in-phase mixer (I-mixer); filtering, by a second LPF, an output of a quadrature-phase mixer (Q-mixer); converting, by a first ADC, an output of the first LPF; converting, by a second ADC, an output of the second LPF; buffering, by a first RX capture data buffer, an output of the first ADC; buffering, by a second RX capture data buffer, an output of the second ADC; buffering, by a TX capture data buffer, a transmitter signal; generating, by a reference generator, a reference signal from an output of the TX data capture buffer; removing, by a DC removal unit, DC from the reference signal; and adaptively tuning, by an adaptive tuning module, an I-mixer digital-to-analog (DAC) code and a Q-mixer DAC code from an output of the first RX data capture buffer, an output of the second RX data capture buffer, an output of the DC removal unit, and a predetermined step size for each of the I-mixer DAC code and the Q-mixer DAC code.

According to one embodiment, a method includes filtering, by a first LPF, an output of an in-phase mixer (I-mixer); filtering, by a second LPF, an output of a quadrature-phase mixer (Q-mixer); converting, by a first ADC, an output of the first LPF; converting, by a second ADC, an output of the second LPF; buffering, by a first RX data capture buffer, an output of the first ADC; buffering, by a second RX data capture buffer, an output of the second ADC; adaptively tuning, by an adaptive tuning module unit, an output of the first RX data capture buffer, an output of the second RX data capture buffer, an output of a DC removal unit, and a predetermined step size for each of the I-mixer and the Q-mixer; buffering, by a TX data capture buffer, a transmitter signal; generating, by a reference generator, a reference signal; and removing, by a DC removal unit, DC from the reference signal.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

According to one embodiment, the present apparatus and method provides IIP2 calibration based on two tone testing to set an optimal mixer DAC code.

According to one embodiment, the present apparatus and method provides adaptive searching that locates an optimal IIP2 DAC code in real-time based on a background real-time second order inter-modulation distortion (IMD2) modulated signal in a power on mode.

According to one embodiment, the present apparatus and method analyzes a format of an IMD2 signal for both I and Q paths, and addresses correlation between the I path and the Q path in an IMD2 component. The present adaptive searching apparatus and method provides an estimation of coefficients of an IMD2 term, which show convergence in spite of the correlation effect between the I path and the Q path.

According to one embodiment, the present apparatus and method may receive input data in the form of a vector or a sample. In addition, the present apparatus and method provides direct current (DC) removal on either a transmitter or a receiver side.

According to one embodiment, IMD2 components in the I, Q paths, due to a second order nonlinear effect of a mixer, may be represented as in Equations (1) and (2) as follows, respectively:

$$y_{2I}(t)=a_{2I}(m,n)G^2A^2(t)=a_{2I}(m,n)\times G^2\times ref(t) \quad (1)$$

$$y_{2Q}(t)=a_{2Q}(m,n)G^2A^2(t)=a_{2Q}(m,n)\times G^2\times ref(t) \quad (2)$$

where $a_{2I}(m, n)$ is a coefficient of a second order term for the I-path, m is an I-mixer DAC code, n is a Q-mixer DAC code, $a_{2Q}(m, n)$ is a coefficient of a second order term for the Q-path, G is a path gain from a transmit antenna to an output of a receiver mixer, which includes duplexer isolation, radio frequency (RF) path loss and gain, and ref (t) is a squared envelope of a transmit signal.

There is a strong dependency between an I-path and a Q-path in an IMD2 component, i.e., the optimal I-DAC code varies when the Q-DAC code changes and vice versa. Therefore, a coefficient of a second order nonlinear term in an I-path may be represented as $a_{2I}(m, n)$ instead of $a_{2I}(m)$. In addition, a coefficient of a second order nonlinear term in a Q-path may be represented as $a_{2Q}(m, n)$ instead of $a_{2I}(n)$.

Figure 1:
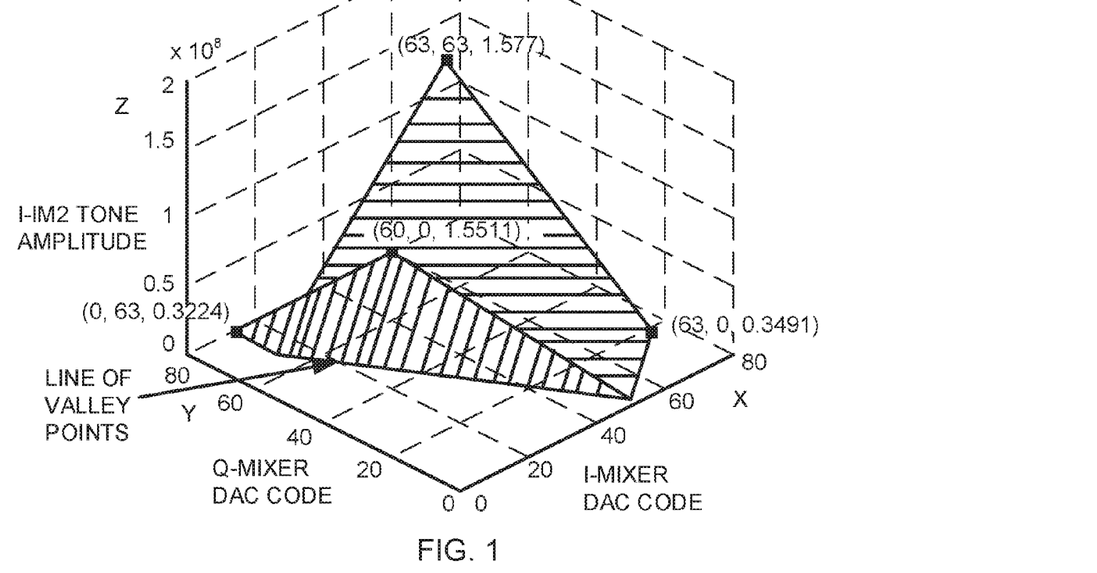
FIG. 1 is a three dimensional (3D) graph of IM2 tone amplitude, I-mixer DAC code, and Q-mixer DAC code based on amplitudes of real parts of a Discrete Fourier Transform (DFT) of captured data, according to an embodiment of the present disclosure.

FIG. 1 is a 3D plot of IM2 tone amplitude, I-mixer DAC code, and Q-mixer DAC code based on amplitudes of real parts of a DFT of captured data, according to an embodiment of the present disclosure, where the z-axis represents IM2 tone amplitude, the x-axis represents the I-mixer DAC code, and the y-axis represents the Q-mixer DAC code.

Figure 2:
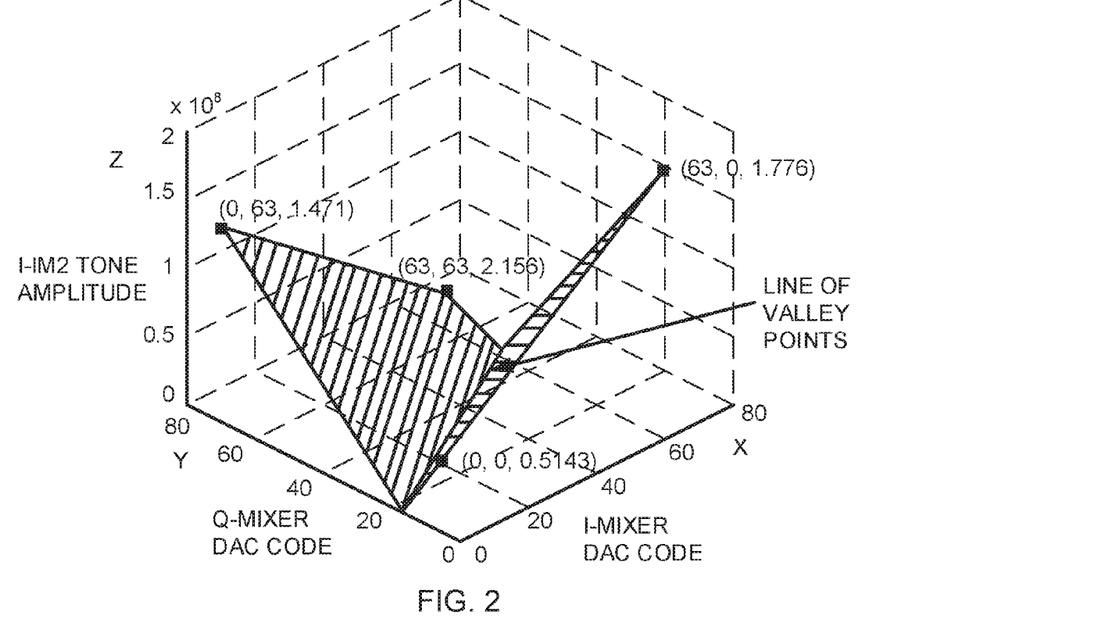
FIG. 2 is a 3D graph of IM2 tone amplitude, I-mixer DAC code, and Q-mixer DAC code based on amplitudes of imaginary parts of a DFT of captured data, according to an embodiment of the present disclosure.

FIG. 2 is a 3D plot of IM2 tone amplitude, I-mixer DAC code, and Q-mixer DAC code based on amplitudes of imaginary parts of the DFT of the captured data used to generate FIG. 1, according to an embodiment of the present disclosure, where the z-axis represents IM2 tone amplitude, the x-axis represents the I-mixer DAC code, and the y-axis represents the Q-mixer DAC code. According to FIGS. 1 and 2, there is a linear relationship between IM2 tone amplitude and I, Q DAC code space.

Based on one or more plane-fitting techniques, the wing-shaped surfaces illustrated in FIGS. 1 and 2 approach a 3D plane. Therefore, the collection of the points (or valley points) at the intersection of two planes (or wings) corresponds to a minimum IM2 tone amplitude of the wings in FIG. 1 and FIG. 2, where the valley points in each of FIGS. 1 and 2 form a straight line. The optimal I-mixer DAC code and the optimal Q-mixer DAC code may be determined by the intersection of the two line segments formed by the valley points.

Figure 3:
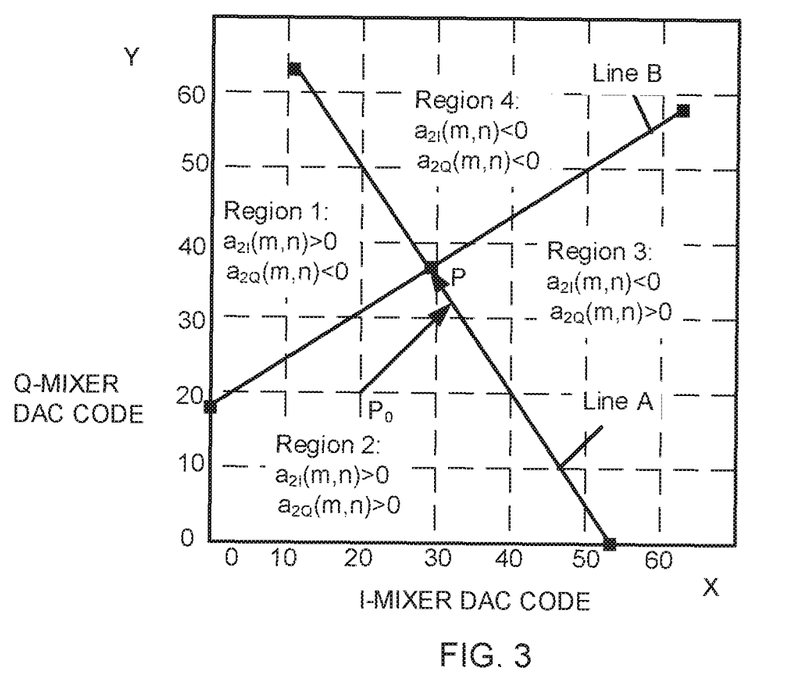
FIG. 3 is a graph for determining an optimal I-mixer DAC code and an optimal Q-mixer DAC code, according to an embodiment of the present disclosure.

FIG. 3 is a graph for determining an optimal I-mixer DAC code and an optimal Q-mixer DAC code, according to an embodiment of the present disclosure.

Referring to FIG. 3, I-mixer DAC codes and Q-mixer DAC codes of FIGS. 1 and 2 are plotted, where line A indicates the valley points in FIG. 1, and line B indicates the valley points in FIG. 2. In the IQ DAC code plane, the sign region of $a_{2I}(m, n)$ is divided by line A (e.g., to the left of line A, $a_{2I}(m, n)$ is positive, and to the right of line A, $a_{2I}(m, n)$ is negative) and the sign region of $a_{2Q}(m, n)$ is divided by line B (e.g., below line B, $a_{2Q}(m, n)$ is positive, and above line B, $a_{2Q}(m, n)$ is negative). Due to the dependency between the I path and the Q path, line B is not strictly horizontal and line A is not strictly vertical. The IQ plane may be divided into four regions segmented by line A and line B, as illustrated in FIG. 3. Signs of $a_{2I}(m, n)$ and $a_{2Q}(m, n)$ in each region are labelled as shown in FIG. 3. However, the present disclosure is not limited thereto, and other signs for the regions may be used.

According to one embodiment, the present apparatus and method implements the following search rules. If $a_{2I}(m, n)>0$, m is incremented by a first predetermined amount (e.g., step size or updating step size), otherwise, m is decremented by a second predetermined amount. If $a_{2Q}(m, n)>0$, n is incremented by a third predetermined amount, otherwise n is decremented by a fourth desired amount. The first, second, third, and fourth predetermined amounts may be equal to each other or different from one or more of each other. According to these search rules, the optimal point P may always be determined no matter where the initial starting point $P_0$ is located in FIG. 3.

For example, a starting point $P_0$ is in region 2, where $a_{2I}(m, n)>0$ and $a_{2Q}(m, n)>0$. Therefore, m and n are each incremented while the point in question is in region 2. Assuming the first predetermined step size and the third predetermined step size are the same for both m and n, then at a certain iteration k, the searching point moves to point $P_1$ (which lies on line A, which is where $a_{2I}(m, n)$ is equal to zero). From $P_1$ onwards, $a_{2I}(m, n)$ oscillates around zero, while $a_{2Q}(m, n)$ is still greater than 0, which leads to the optimal point P. As long as there are estimations for both $a_{2I}(m, n)$ and $a_{2Q}(m, n)$ from received data and reference data, m and n may be updated.

Based on IQ dependency information, convergence speed to point P may be optimized, i.e., the updating step sizes may be optimized using the following $\Delta_I$ and $\Delta_Q$ for I and Q paths, respectively, as represented in Equations (3), (4), and (5) as follows:

$$\Delta_I + 1j^* \Delta_Q = \mu \times (\widehat{a_{2I}}(m,n) + 1j^* \widehat{a_{2Q}}(m,n)) \times (\cos(\theta_0) + 1j^* \sin(\theta_0)) \tag{3}$$

$$\Delta_I = \mu \times (\widehat{a_{2I}}(m,n) \times \cos(\theta_0) - \widehat{a_{2Q}}(m,n) \times \sin(\theta_0)) \tag{4}$$

$$\Delta_Q = \mu \times (\widehat{a_{2Q}}(m,n) \times \cos(\theta_0) + \widehat{a_{2I}}(m,n) \times \sin(\theta_0)) \tag{5}$$

where $\widehat{a_{2I}}(m, n)$ and $\widehat{a_{2Q}}(m, n)$ are estimated values at a current iteration, $\mu$ is a predetermined positive number, and $\theta_0$ is a slope of line B in FIG. 3 which is obtained from a preset calibration (e.g., a factory calibration). Accordingly, the direction of an update to $a_{2I}(m, n)$ and $a_{2Q}(m, n)$ always points to the optimal point P from a current location. If information on a value of $\theta_0$ is not available, then $\theta_0$ may be set to zero.

According to one embodiment, $a_{2I}(m, n)$ and $a_{2Q}(m, n)$ are estimated from vectors of reference samples and receiver samples. A signal model may be represented in Equation (6) as follows, where N is a length of a data vector (or length of a data capture buffer):

$$\begin{pmatrix} y(1) \\ y(2) \\ \vdots \\ y(N-1) \\ y(N) \end{pmatrix} = \begin{pmatrix} rx(1) \\ rx(2) \\ \vdots \\ rx(N-1) \\ rx(N) \end{pmatrix} + a(m,n) \times \begin{pmatrix} ref(1) \\ ref(2) \\ \vdots \\ ref(N-1) \\ ref(N) \end{pmatrix} + \begin{pmatrix} Noise(1) \\ Noise(2) \\ \vdots \\ Noise(N-1) \\ Noise(N) \end{pmatrix} + \begin{pmatrix} DC \\ DC \\ \vdots \\ DC \\ DC \end{pmatrix} \tag{6}$$

If $y=(y(1), y(2), \ldots, y(N))^T$, $rx=(rx(1),rx(2), \ldots, rx(N))^T$, $ref=(ref(1),ref(2), \ldots, ref(N))^T$, $Noise=(Noise(1),Noise(2), \ldots, Noise(N))^T$, and $DC=DC \times 1$, where $1=(1,1,\ldots,1)^T$ is a vector of length N with all the elements in the vector being 1, then Equation (6) above may be re-written into a vector form in Equation (7) as follows:

$$y = rx + a(m,n) \times ref + Noise + DC \times 1 \tag{7}$$

Based on the captured data vector y and ref, a mean squared error (MSE) criterion may be used to determine an estimation of a coefficient of an IMD2 term and a DC level, such that Equation (8) below may be minimized:

$$(\hat{\beta}, \hat{dc}) = \underset{\beta, dc}{\operatorname{argmin}} \|y - \beta \times ref - dc \times 1\|^2 \tag{8}$$

where $\|v\|^2 = v^T v$, and v is an N×1 real vector. From Equation (8) above, Equation (9) may be obtained as follows:

$$\hat{\beta} = \frac{ref^T \times (y - \operatorname{mean}(y) \times 1)}{\|ref - \operatorname{mean}(ref) \times 1\|^2} = \frac{y^T \times (ref - \operatorname{mean}(ref) \times 1)}{\|ref - \operatorname{mean}(ref) \times 1\|^2} = \frac{y^T \times ref - \operatorname{mean}(ref) \times \operatorname{mean}(y)}{\|ref - \operatorname{mean}(ref) \times 1\|^2} \tag{9}$$

where $\widehat{dc}$ =mean(y)−$\hat{\beta}$×mean(ref), and $$\text{mean}(y) = \frac{\sum_{i=1}^{N} y(i)}{N}$$

and $$\text{mean}(ref) = \frac{\sum_{i=1}^{N} ref(i)}{N}$$

are averaged values of received samples and reference samples, respectively.

The estimation of $\hat{\beta}$ is a cross-correlation between two vectors (with DC removal from one of the vectors, but not necessarily from both vectors), which is normalized by the DC removed reference samples. DC removal may be performed on either transmitted samples or received samples. In addition, the sign of $\hat{\beta}$ may be determined by the cross-correlation.

Figure 4:
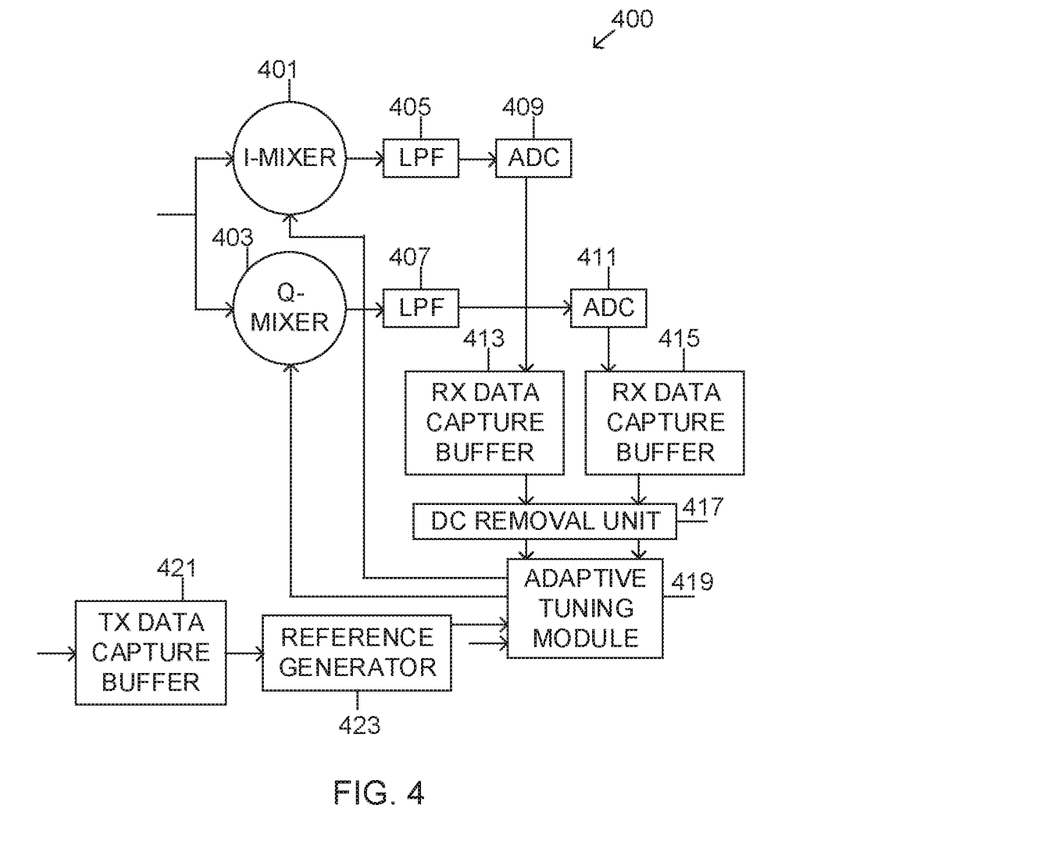
FIG. 4 is a block diagram of an apparatus for providing background real-time IIP2 calibration, according to an embodiment of the present disclosure.

FIG. 4 is a block diagram of an apparatus 400 for providing background real-time IIP2 calibration, according to an embodiment of the present disclosure.

Referring to FIG. 4, the apparatus 400 includes an I-mixer 401, a Q-mixer 403, a first low pass filter (LPF) 405, a second LPF 407, a first analog-to-digital converter (ADC) 409, a second ADC 411, a first receiver (RX) data capture buffer 413, a second RX data capture buffer 415, a DC removal unit 417, an adaptive tuning module 419, a transmitter (TX) data capture buffer 421, and a reference generator 423.

The I-mixer 401 includes a first input, a second input for receiving an I-mixer DAC code setting from the adaptive tuning module 419, and an output.

The Q-mixer 403 includes a first input connected to the input of the I-mixer 401, a second input for receiving a Q-mixer DAC code setting from the adaptive tuning module 419, and an output.

The first LPF 405 includes an input connected to the output of the I-mixer 401, and an output.

The second LPF 407 includes an input connected to the output of the Q-mixer 403, and an output.

The first ADC 409 includes an input connected to the output of the first LPF 405, and an output.

The second ADC 411 includes an input connected to the output of the second LPF 407, and an output.

The first RX data capture buffer 413 includes an input connected to the output of the first ADC 409, and an output.

The second RX data capture buffer 415 includes an input connected to the output of the second ADC 411, and an output.

The DC removal unit 417 includes a first input connected to the output of the first RX data capture buffer 413, a second input connected to the output of the second RX data capture buffer 415, a first output, and a second output.

The adaptive tuning module 419, includes a first input connected to the first output of the DC removal unit 417, a second input connected to the second output of the DC removal unit 417, a third input from the reference generator 423, a fourth input for receiving a predetermined step size for each of the I-mixer 401 and the Q-mixer 403, a first output connected to the second input of the I-mixer 401, and a second output connected to the second input of the Q-mixer 403. The step sizes for the I-mixer 401 and the Q-mixer 403 may be the same or may be different from at least one of the other steps sizes according to the four regions indicated in FIG. 3.

The TX data capture buffer 421 includes an input, and an output.

The reference generator 423 includes an input connected to the output of the TX data capture buffer 421, and an output connected to the third input of the adaptive tuning module 419.

Figure 5:
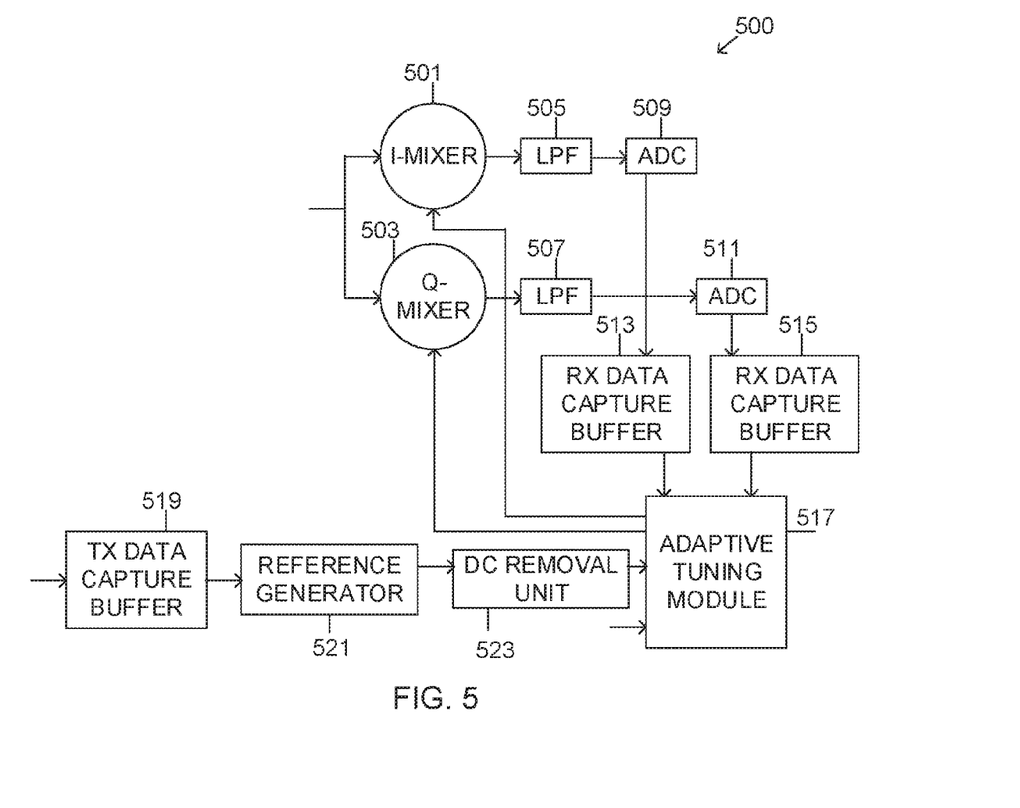
FIG. 5 is a block diagram of an apparatus for providing background real-time IIP2 calibration, according to an embodiment of the present disclosure.

FIG. 5 is a block diagram of an apparatus 500 for providing background real-time IIP2 calibration, according to an embodiment of the present disclosure, where a DC removal unit 523 is on the transmitter side, instead of on the receiver side as in FIG. 4.

Referring to FIG. 5, the apparatus 500 includes an I-mixer 501, a Q-mixer 503, a first low pass filter (LPF) 505, a second LPF 507, a first analog-to-digital converter (ADC) 509, a second ADC 511, a first receiver (RX) data capture buffer 513, a second RX data capture buffer 515, an adaptive tuning module 517, a transmitter (TX) data capture buffer 519, a reference generator 521, and the DC removal unit 523.

The I-mixer 501 includes a first input, a second input for receiving an I-mixer DAC code setting from the adaptive tuning module 517, and an output.

The Q-mixer 503 includes a first input connected to the input of the I-mixer 501, a second input for receiving a Q-mixer DAC code setting from the adaptive tuning module 517, and an output.

The first LPF 505 includes an input connected to the output of the I-mixer 501, and an output.

The second LPF 507 includes an input connected to the output of the Q-mixer 503, and an output.

The first ADC 509 includes an input connected to the output of the first LPF 505, and an output.

The second ADC 511 includes an input connected to the output of the second LPF 507, and an output.

The first RX data capture buffer 513 includes an input connected to the output of the first ADC 509, and an output.

The second RX data capture buffer 515 includes an input connected to the output of the second ADC 511, and an output.

The adaptive tuning module 517 includes a first input connected to the output of the first RX data capture buffer 513, a second input connected to the output of the second RX data capture buffer 515, a third input from the DC removal unit 523, a fourth input for receiving a predetermined step size for each of the I-mixer 501 and the Q-mixer 503, a first output connected to the second input of the I-mixer 501, and a second output connected to the second input of the Q-mixer 503. The step sizes for the I-mixer 501 and the Q-mixer 503 may be the same or may be different from at least one of the other step sizes according to the four regions indicated in FIG. 3.

The TX data capture buffer 519 includes an input, and an output.

The reference generator 521 includes an input connected to the output of the TX data capture buffer 519, and an output.

The DC removal unit 523 includes an input connected to the output of the reference generator 521, and an output connected to the third input of the adaptive tuning module 517.

Figure 6:
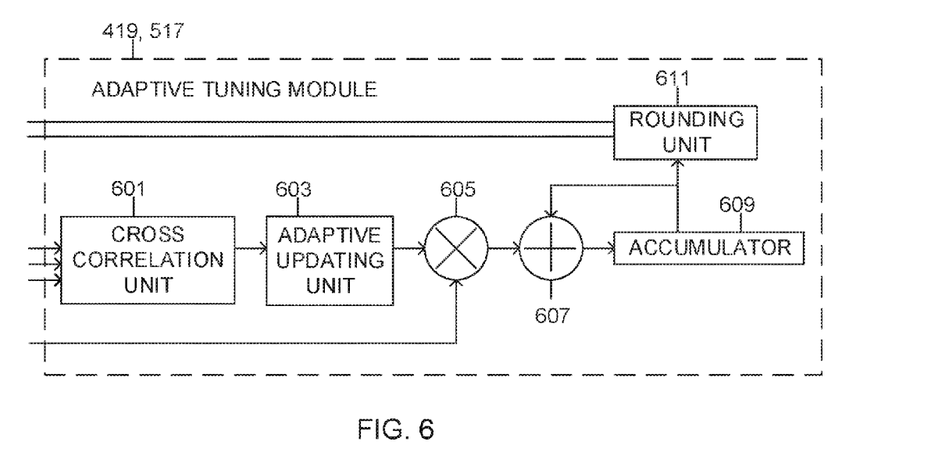
FIG. 6 is a block diagram of an adaptive tuning module of FIGS. 4 and 5, according to an embodiment of the present disclosure.

FIG. 6 is a block diagram of the adaptive tuning modules 419, 517 of FIGS. 4 and 5, according to an embodiment of the present disclosure.

Referring to FIG. 6, the adaptive tuning modules 419, 517 each include a cross correlation unit 601, an adaptive updating unit 603, a multiplier 605, an adder 607, an accumulator 609, and a rounding unit 611.

The cross correlation unit 601 includes a first input for receiving DC-removed RX data in the I-path, a second input for receiving DC-removed RX data in the Q-path, a third input for receiving a TX reference signal, and an output.

The adaptive updating unit 603 includes an input connected to the output of the cross correlation unit 601, and an output. The calculations performed by the adaptive updating unit 603 are shown in Equations (10)-(15) as follows:

$$\text{step}_x = \text{cross\_val\_I} \times \cos(\theta_0) - \text{cross\_val\_Q} \times \sin(\theta_0) \quad (10)$$

$$\text{step}_y = \text{cross}_{val_I} \times \sin(\theta_0) + \text{cross\_val\_Q} \times \cos(\theta_0) \quad (11)$$

$$dac\_\text{code\_acc\_}I = \mu \times \text{step}_x \div \sqrt{\text{step}_x^2 + \text{step}_y^2} \quad (12)$$

$$dac\_\text{code\_acc\_}Q = \mu \times \text{step}_y \div \sqrt{\text{step}_x^2 + \text{step}_y^2} \quad (13)$$

$$dac\_\text{code\_}I = \text{round}(dac\_\text{code\_acc\_}I) \quad (14)$$

$$dac\_\text{code\_}Q = \text{round}(dac\_\text{code\_acc\_}Q) \quad (15)$$

where $\theta_0$ is a degree of a slope of a line of valley points of a plot of second order intermodulation (IM2) tone amplitude, I-mixer digital-to-analog (DAC) code, and Q-mixer DAC code based on amplitudes of imaginary parts of a discrete Fourier transform (DFT) of captured data (e.g., a degree of a slope of line B in FIG. 3), where cross_val_I is a cross correlation between the reference signal and the real part of a received signal, cross_val_Q is a cross correlation between the reference signal and the imaginary part of the received signal, $\mu$ is a predetermined number; dac_code_acc_I is an accumulation for an I-mixer DAC code, dac_code_acc_Q is an accumulation for a Q-mixer DAC code, dac_code_acc_I is a rounding of dac_code_acc_I, and dac_code_acc_Q is a rounding of dac_code_acc_Q, and where the rounding may be up or down.

The multiplier 605 includes a first input connected to the output of the adaptive updating unit 603, a second input for receiving a predetermined step size for each of the I-mixers 401, 501 and the Q-mixers 403, 503, and an output. The predetermined step sizes may be the same or may be different from at least one of the other step sizes according to the four regions indicated in FIG. 3.

The adder 607 includes a first input connected to the output of the multiplier 605, a second input connected to the output of the accumulator 609, and an output.

The accumulator 609 includes an input connected to the output of the adder 607, and an output connected to the second input of the adder 607 and an input of the rounding unit 611.

The rounding unit 611 includes an input connected to the output of the accumulator 609, a first output for tuning the I-mixers 401, 501, and a second output for tuning the Q-mixers 403, 503.

According to one embodiment, a sign block may be included in the adaptive tuning module 419, 517 to reduce a fixed-point computation burden, since the magnitude of the output of the cross correlation unit 601 may be absorbed into the step size.

Figure 7:
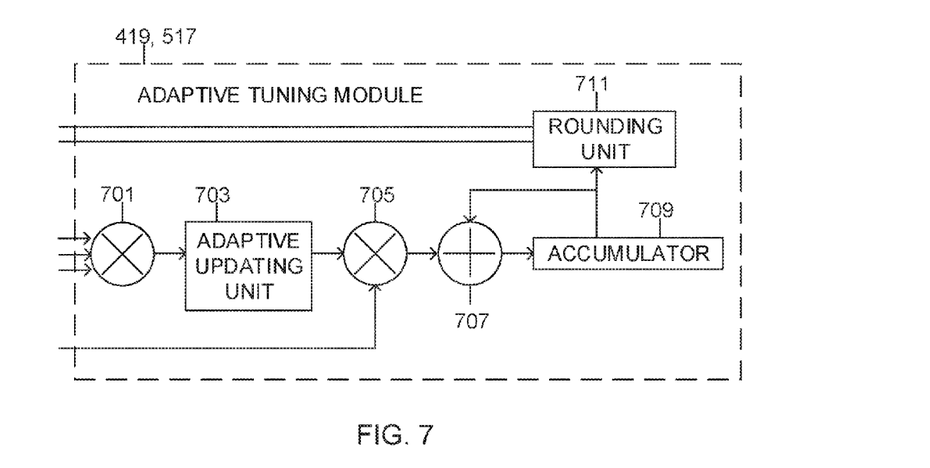
FIG. 7 is a block diagram of an adaptive tuning module of FIGS. 4 and 5, according to an embodiment of the present disclosure.

FIG. 7 is a block diagram of the adaptive tuning modules 419, 517 of FIGS. 4 and 5, according to an embodiment of the present disclosure. FIG. 7 processes inputs on a sample basis, instead of on a vector basis.

Referring to FIG. 7, the adaptive tuning modules 419, 517 each includes a first multiplier 701, an adaptive updating unit 703, a second multiplier 705, an adder 707, an accumulator 709, and a rounding unit 711.

The first multiplier 701 includes a first input for receiving RX data in the I-path, a second input for receiving RX data in the Q-path, a third input for receiving a TX reference signal, and an output.

The adaptive updating unit 703 includes an input connected to the output of the first multiplier 701, and an output.

The second multiplier 705 includes a first input connected to the output of the adaptive updating unit 703, a second input for receiving a predetermined step size for each of the I-mixers 401, 501 and the Q-mixers 403, 503, and an output. The predetermined step sizes may be the same or may be different from at least one of the other step sizes according to the four regions indicated in FIG. 3.

The adder 707 includes a first input connected to the output of the second multiplier 705, a second input connected to the output of the accumulator 709, and an output.

The accumulator 709 includes an input connected to the output of the adder 707, and an output connected to the second input of the adder 707 and to the rounding unit 711.

The rounding unit 711 includes an input connected to the output of the accumulator 709, a first output for tuning the I-mixers 401, 501, and a second output for tuning the Q-mixers 403, 503.

According to one embodiment, inputs may be processed on a sample basis instead of on a vector basis. In addition, the DC removal unit 417, 523 in FIGS. 4 and 5 may be on the transmitter side, instead of on the receiver side. Furthermore, the DC removal unit 417, 523 may be a notch filter with a stopband around DC.

Figure 8:
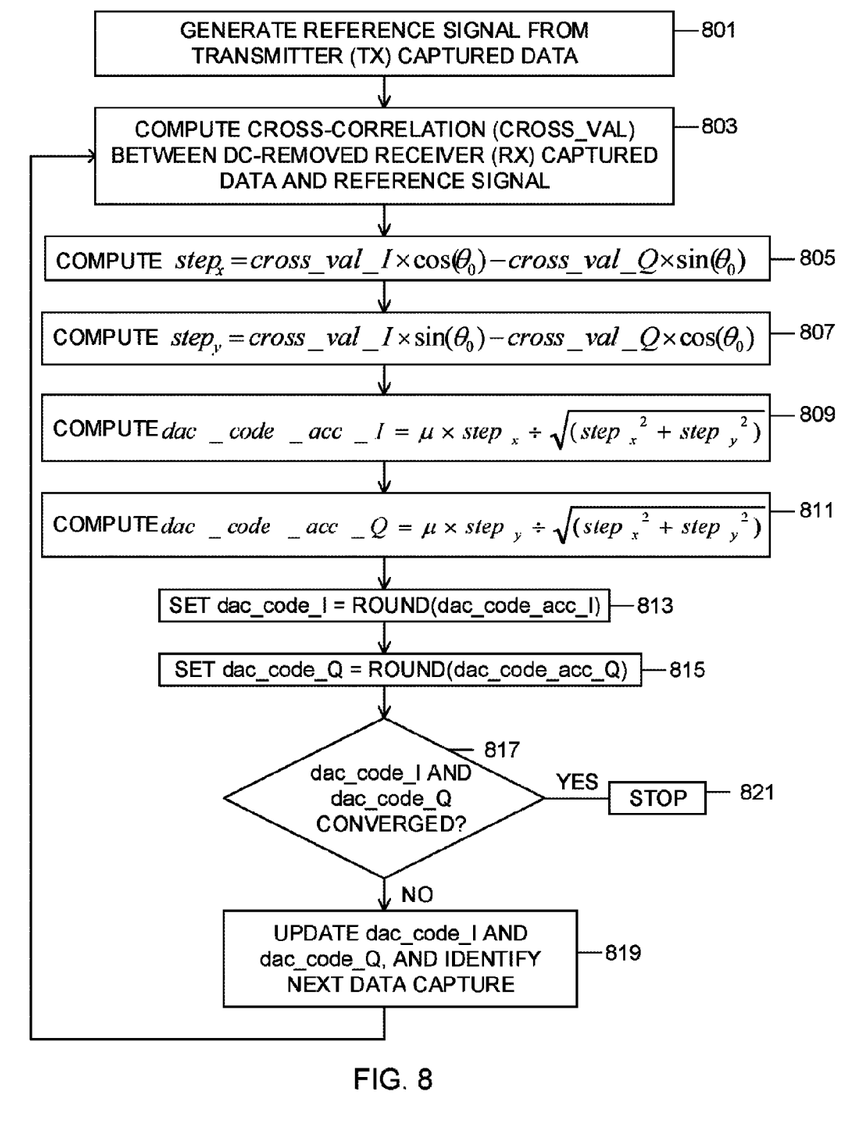
FIG. 8 is a flowchart of a method of determining background real-time IIP2 calibration, according to an embodiment of the present disclosure.

FIG. 8 is a flowchart of a method of determining background real-time IIP2 calibration, according to an embodiment of the present disclosure. The background real-time IIP2 calibration may be determined by adaptive searching. Adaptive searching delays alignment between transmitted samples and received samples, where data is captured at both a transmitter and a receiver. A reference sample is generated based on the transmitted samples, and a DC value is removed from the received signal. Cross correlations between the reference signal and real parts and imaginary parts of the received signal are performed, where an I-mixer DAC code and a Q-mixer DAC code are updated based on the signs of the cross correlation values. An updating step size is determined for each I, Q path based on magnitude and IQ dependency information. The present apparatus and method determines whether each of the searched I-mixer DAC code and the Q-mixer DAC code converges or not. If each of the searched I-mixer DAC code and the Q-mixer DAC code converges, adaptive searching terminates. Otherwise, the I-mixer DAC code and the Q-mixer DAC code are updated and additional data is captured.

Referring to FIG. 8, a reference generator generates a reference signal from transmitter (TX) captured data at 801.

At 803, a cross correlation unit computes a cross correlation value between DC-removed receiver (RX) captured data and the reference signal.

At 805, an adaptive tuning module computes $\text{step}_x$ as represented in Equation (10) above.

At 807, the adaptive tuning module further $\text{step}_y$ as represented in Equation (11) above.

At 809, the adaptive tuning module further computes dac_code_acc_I as represented in Equation (12) above.

At 811, the adaptive tuning module further computes dac_code_acc_Q as represented in Equation (13) above.

At 813, the adaptive tuning module further computes dac_code_I as represented in Equation (14) above.

At 815, the adaptive tuning module further computes dac_code_Q as represented in Equation (15) above.

At 817, the the present method determines if each of the dac_code_I and the dac_code_Q converges.

At 819, if each of the dac_code_I and the dac_code_Q does not converge then the present method updates the dac_code_I and the dac_code_Q, identifies the next data capture, and returns to 803.

At 821, if each of the dac_code_I and the dac_code_Q converges then the present method terminates.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a first low pass filter (LPF), including an input connected to an output of an in-phase mixer (I-mixer), and an output;
   a second LPF, including an input connected to an output of a quadrature-phase mixer (Q-mixer), and an output;
   a first analog-to-digital converter (ADC), including a first input connected to the output of the first LPF, and an output;
   a second ADC, including a first input connected to the output of the second LPF, and an output;
   a first receiver (RX) data capture buffer configured to store a plurality of data vectors, including an input connected to the output of the first ADC, and an output;
   a second RX data capture buffer configured to store a plurality of data vectors, including an input connected to the output of the second ADC, and an output;
   a direct current (DC) removal unit, including a first input connected to the output of the first RX data capture buffer, a second input connected to the output of the second RX data capture buffer, a first output, and a second output;
   an adaptive tuning module unit, including a first input connected to the first output of the DC removal unit, a second input connected to the second output of the DC removal unit, a third input, a fourth input for receiving a predetermined step size for each of the I-mixer and the Q-mixer, a first output connected to a second input of the I-mixer, and a second output connected to a second input of the Q-mixer;
   a transmitter (TX) data capture buffer, including an input, and an output; and
   a reference generator, including an input connected to the output of the TX data capture buffer, and an output connected to the third input of the adaptive tuning module.

2. The apparatus of claim 1, wherein the adaptive tuning module comprises:
   a cross correlation unit, including a first input, a second input, a third input, and an output;
   an adaptive updating unit, including an input connected to the output of the cross correlation unit, and an output;
   a multiplier, including a first input connected to the output of the adaptive updating unit, a second input for receiving the predetermined step size for each of the I-mixer and the Q-mixer, a first output connected to the second input of the I-mixer, and an output;
   an adder, including a first input connected to the output of the multiplier, a second input, and an output;
   an accumulator, including an input connected to the output of the adder, and an output connected to the second input of the adder; and
   a rounding unit, including an input connected to the output of the accumulator, a first output, and a second output.

3. The apparatus of claim 2, wherein the adaptive updating unit is configured to: compute $$step_x = cross\_val\_I \times \cos(\theta_0) - cross\_val\_Q \times \sin(\theta_0);$$

$$step_y = cross\_val\_I \times \sin(\theta_0) + cross\_val\_Q \times \cos(\theta_0);$$

$$dac\_code\_acc\_I = \mu \times step_x \div \sqrt{step_x^2 + step_y^2};$$

$$dac\_code\_acc\_Q = \mu \times step_y \div \sqrt{step_x^2 + step_y^2};$$

$$dac\_code\_I = round(dac\_code\_acc\_I); \text{ and}$$

$$dac\_code\_Q = round(dac\_code\_acc\_Q),$$

where $\theta_0$ is a degree of a slope of a line of valley points of a plot of second order intermodulation (IM2) tone amplitude, I-mixer digital-to-analog (DAC) code, and Q-mixer DAC code based on amplitudes of imaginary parts of a discrete Fourier transform (DFT) of captured data, where cross_val_I is a cross correlation between the reference signal and the real part of a received signal, cross_val_Q is a cross correlation between the reference signal and the imaginary part of the received signal, $\mu$ is a predetermined number; dac_code_acc_I is an accumulation for an I-mixer DAC code, dac_code_acc_Q is an accumulation for a Q-mixer DAC code, dac_code_I is a rounding of dac_code_acc_I, and where dac_code_Q is a rounding of dac_code_acc_Q, and where the rounding may be up or down; and
   terminate processing if dac_code_acc_I and dac_code_acc_Q each converge, otherwise, update dac_code_acc_I and dac_code_acc_Q, identify a next data capture in the TX data capture buffer, and generate, by the reference generator, the reference signal from the output of the TX data capture buffer.

4. The apparatus of claim 1, wherein the adaptive tuning module comprises:
   a first multiplier, including a first input, a second input, a third input, and an output;
   an adaptive updating unit, including an input connected to the output of the first multiplier, and an output;
   a second multiplier, including a first input connected to the output of the adaptive updating unit, a second input for receiving the predetermined step size for each of the I-mixer and the Q-mixer, a first output connected to the second input of the I-mixer, and an output;
   an adder, including a first input connected to the output of the second multiplier, a second input, and an output;
   an accumulator, including an input connected to the output of the adder, and an output connected to the second input of the adder; and
   a rounding unit, including an input connected to the output of the accumulator, a first output, and a second output.

5. The apparatus of claim 1, further comprising:
the I-mixer, including a first input, the second input for receiving an I-mixer digital-to-analog (DAC) code, and the output; and
the Q-mixer, including a first input connected to the first input of the I-mixer, the second input for receiving a Q-mixer DAC code, and the output;
wherein the predetermined step size for each of the I-mixer and the Q-mixer is one of being equal for each of the I-mixer and the Q-mixer or being different from at least one of each of the I-mixer and the Q-mixer according to regions established by a line of valley points of a plot of second order intermodulation (IM2) tone amplitude, I-mixer digital-to-analog (DAC) code, and Q-mixer DAC code based on amplitudes of real parts of a discrete Fourier transform (DFT) of captured data and a line of valley points of a plot of IM2 tone amplitude, I-mixer DAC code, and Q-mixer DAC code based on amplitudes of imaginary parts of the DFT of captured data.

6. An apparatus, comprising:
a first low pass filter (LPF), including an input connected to an output of an in-phase mixer (I-mixer), and an output;
a second LPF, including an input connected to an output of a quadrature-phase (Q-mixer), and an output;
a first analog-to-digital converter (ADC), including a first input connected to the output of the first LPF, and an output;
a second ADC, including a first input connected to the output of the second LPF, and an output;
a first receiver (RX) data capture buffer configured to store a plurality of data vectors, including an input connected to the output of the first ADC, and an output;
a second RX data capture buffer configured to store a plurality of data vectors, including an input connected to the output of the second ADC, and an output;
an adaptive tuning module unit, including a first input connected to the output of the first RX data capture buffer, a second input connected to the output of the second RX data capture buffer, a third input, a fourth input for receiving a predetermined step size for each of the I-mixer and the Q-mixer, a first output connected to a second input of the I-mixer, and a second output connected to a second input of the Q-mixer;
a transmitter (TX) data capture buffer, including an input, and an output;
a reference generator, including an input connected to the output of the TX data capture buffer, and an output; and
a direct current (DC) removal unit, including an input connected to the output of the reference generator, and an output connected to the third input of the adaptive tuning module.

7. The apparatus of claim 6, wherein the adaptive tuning module comprises:
a cross correlation unit, including a first input, a second input, a third input, and an output;
an adaptive updating unit, including an input connected to the output of the cross correlation unit, and an output;
a multiplier, including a first input connected to the output of the adaptive updating unit, a second input for receiving the predetermined step size for each of the I-mixer and the Q-mixer, a first output connected to the second input of the I-mixer, and an output;
an adder, including a first input connected to the output of the multiplier, a second input, and an output;
an accumulator, including an input connected to the output of the adder, and an output connected to the second input of the adder; and
a rounding unit, including an input connected to the output of the accumulator, a first output, and a second output.

8. The apparatus of claim 7, wherein the adaptive updating unit is configured to: compute:

$$step_x = cross\_val\_I \times \cos(\theta_0) - cross\_val\_Q \times \sin(\theta_0);$$

$$step_y = cross_{val_I} \times \sin(\theta_0) + cross\_val\_Q \times \cos(\theta_0);$$

$$dac\_code\_acc\_I = \mu \times step_x \div \sqrt{step_x^2 + step_y^2};$$

$$dac\_code\_acc\_Q = \mu \times step_y \div \sqrt{step_x^2 + step_y^2};$$

$$dac\_code\_I = round(dac\_code\_acc\_I); \text{ and}$$

$$dac\_code\_Q = round(dac\_code\_acc\_Q),$$

where $\theta_0$ is a degree of a slope of a line of valley points of a plot of second order intermodulation (IM2) tone amplitude, I-mixer digital-to-analog (DAC) code, and Q-mixer DAC code based on amplitudes of imaginary parts of a discrete Fourier transform (DFT) of captured data, where cross_val_I is a cross correlation between the reference signal and the real part of a received signal, cross_val_Q is a cross correlation between the reference signal and the imaginary part of the received signal, µ is a predetermined number; dac_code_acc_I is an accumulation for an I-mixer DAC code, dac_code_acc_Q is an accumulation for a Q-mixer DAC code, dac_code_I is a rounding of dac_code_acc_I, and where dac_code_Q is a rounding of dac_code_acc_Q, and where the rounding may be up or down; and
terminate processing if dac_code_acc_I and dac_code_acc_Q each converge, otherwise, update dac_code_acc_I and dac_code_acc_Q, identify a next data capture in the TX data capture buffer, and return to generating, by the reference generator, the reference signal from the output of the TX data capture buffer.

9. The apparatus of claim 6, wherein the adaptive tuning module comprises:
a first multiplier, including a first input, a second input, a third input, and an output;
an adaptive updating unit, including an input connected to the output of the first multiplier, and an output;
a second multiplier, including a first input connected to the output of the adaptive updating unit, a second input for receiving the predetermined step size for each of the I-mixer and the Q-mixer, a first output connected to the second input of the I-mixer, and an output;
an adder, including a first input connected to the output of the second multiplier, a second input, and an output;
an accumulator, including an input connected to the output of the adder, and an output connected to the second input of the adder; and
a rounding unit, including an input connected to the output of the accumulator, a first output, and a second output.

10. The apparatus of claim 6, further comprising:
the I-mixer), including a first input, the second input for receiving an I-mixer digital-to-analog (DAC) code, and the output; and
the Q-mixer, including a first input connected to the input of the I-mixer, the second input for receiving a Q-mixer DAC code, and the output;

wherein the DC removal unit is comprised of a notch filter with a stopband around DC.

11. A method, comprising:

filtering, by a first low pass filter (LPF), an output of an in-phase mixer (I-mixer);

filtering, by a second LPF, an output of a quadrature-phase mixer (Q-mixer);

converting, by a first analog-to-digital converter (ADC), an output of the first LPF;

converting, by a second ADC, an output of the second LPF;

buffering, by a first receiver (RX) data capture buffer, a plurality of data vectors from an output of the first ADC;

buffering, by a second receiver (RX) data capture buffer, a plurality of data vectors from an output of the second ADC;

removing, by a direct current (DC) removal unit, DC from outputs of the first RX data capture buffer and the second RX data capture buffer;

buffering, by a transmitter (TX) data capture buffer, a transmitter signal;

generating, by a reference generator, a reference signal from an output of the TX data capture buffer;

adaptively tuning, by an adaptive tuning module, an I-mixer digital-to-analog (DAC) code and a Q-mixer DAC code from an output of the reference generator, a first output of the DC removal unit, a second output of the DC removal unit, and a predetermined step size for each of the I-mixer DAC code and the Q-mixer DAC code.

12. The method of claim 11, further comprising, by the adaptive tuning module:

cross correlating, by a cross correlation unit, a first input, a second input, and a third input;

adaptively updating, by an adaptive updating unit, the I-mixer DAC code and the Q-mixer DAC code from an output of the cross correlation unit;

multiplying, by a multiplier, an output of the adaptive updating unit and the predetermined step size for each of the I-mixer and the Q-mixer;

adding, by an adder, an output of the multiplier and an output of an accumulator;

accumulating, by the accumulator, an output of the adder; and rounding, by a rounding unit, an output of the accumulator.

13. The method of claim 12, further comprising, by the adaptive updating unit:

computing:

$$step_x = cross\_val\_I \times \cos(\theta_0) - cross\_val\_Q \times \sin(\theta_0);$$

$$step_y = cross_{val} \times \sin(\theta_0) + cross\_val\_Q \times \cos(\theta_0);$$

$$dac\_code\_acc\_I = \mu \times step_x \div \sqrt{step_x^2 + step_y^2};$$

$$dac\_code\_acc\_Q = \mu \times step_y \div \sqrt{step_x^2 + step_y^2};$$

$$dac\_code\_I = round(dac\_code\_acc\_I); \text{ and}$$

$$dac\_code\_Q = round(dac\_code\_acc\_Q),$$

where $\theta_0$ is a degree of a slope of a line of valley points of a plot of second order intermodulation (IM2) tone amplitude, I-mixer DAC code, and Q-mixer DAC code based on amplitudes of imaginary parts of a discrete Fourier transform (DFT) of captured data, where cross_val_I is a cross correlation between the reference signal and the real part of a received signal, cross_val_Q is a cross correlation between the reference signal and the imaginary part of the received signal, μ is a predetermined number; dac_code_acc_I is an accumulation for an I-mixer DAC code, dac_code_acc_Q is an accumulation for a Q-mixer DAC code, dac_code_I is a rounding of dac_code_acc_I, and where dac_code_Q is a rounding of dac_code_acc_Q, and where the rounding may be up or down; and terminating processing if dac_code_acc_I and dac_code_acc_Q each converge, otherwise, updating dac_code_acc_I and dac_code_acc_Q, identifying a next data capture in the TX data capture buffer, and returning to generating, by the reference generator, the reference signal from the output of the TX data capture buffer.

14. The method of claim 11, further comprising, by the adaptive tuning module:

multiplying, by a first multiplier, a first input, a second input, and a third input;

adaptively updating, by an adaptive updating unit, an output of the first multiplier;

multiplying, by a second multiplier, an output of the adaptive updating unit and the predetermined step size for each of the I-mixer and the Q-mixer;

adding, by an adder, an output of the second multiplier and an output of an accumulator;

accumulating, by the accumulator, an output of the adder; and rounding, by a rounding unit, an output of the accumulator.

15. The method of claim 11, further comprising:

mixing, by the I-mixer, a received signal and an I-mixer digital-to-analog (DAC) code; and mixing, by the Q-mixer, the received signal and a Q-mixer DAC code;

wherein the predetermined step size for each of the I-mixer and the Q-mixer is one of being equal for each of the I-mixer and the Q-mixer or being different from at least one of each of the I-mixer and the Q-mixer according to regions established by a line of valley points of a plot of second order intermodulation (IM2) tone amplitude, I-mixer DAC code, and Q-mixer DAC code based on amplitudes of real parts of a discrete Fourier transform (DFT) of captured data and a line of valley points of a plot of IM2 tone amplitude, I-mixer DAC code, and Q-mixer DAC code based on amplitudes of imaginary parts of the DFT of captured data.

16. A method, comprising:

filtering, by a first low pass filter (LPF), an output of an in-phase mixer (I-mixer);

filtering, by a second LPF, an output of a quadrature-mixer (Q-mixer);

converting, by a first analog-to-digital converter (ADC), an output of the first LPF;

converting, by a second ADC, an output of the second LPF;

buffering, by a first receiver (RX) data capture buffer, an output of the first ADC;

buffering, by a second RX data capture buffer, an output of the second ADC;

adaptively tuning, by an adaptive tuning module unit, an output of the first RX data capture buffer, an output of the second RX data capture buffer, an output of a direct current (DC) removal unit, and a predetermined step size for each of the I-mixer and the Q-mixer;

buffering, by a transmitter (TX) data capture buffer, a transmitter signal;

generating, by a reference generator, a reference signal; and removing, by a direct current (DC) removal unit, DC from the reference signal.

17. The method of claim 16, further comprising, by the adaptive tuning module:
cross correlating, by a cross correlation unit, a first input, a second input, and a third input;
adaptively updating, by an adaptive updating unit, an output of the cross correlation unit;
multiplying, by a multiplier, an output of the adaptive updating unit and the predetermined step size for each of the I-mixer and the Q-mixer;
adding, by an adder, an output of the multiplier and an output of an accumulator;
accumulating, by the accumulator, an output of the adder; and
rounding, by a rounding unit, an output of the accumulator.

18. The method of claim 17, further comprising, by the adaptive updating unit:
computing:

$$step_x = cross\_val\_I \times \cos(\theta_0) - cross\_val\_Q \times \sin(\theta_0);$$

$$step_y = cross\_val\_I \times \sin(\theta_0) + cross\_val\_Q \times \cos(\theta_0);$$

$$dac\_code\_acc\_I = \mu \times step_x \div \sqrt{step_x^2 + step_y^2};$$

$$dac\_code\_acc\_Q = \mu \times step_y \div \sqrt{step_x^2 + step_y^2};$$

$$dac\_code\_I = round(dac\_code\_acc\_I); \text{ and}$$

$$dac\_Code\_Q = Round(dac\_Code\_acc\_Q),$$

where $\theta_0$ is a degree of a slope of a line of valley points of a plot of second order intermodulation (IM2) tone amplitude, I-mixer digital-to-analog (DAC) code, and Q-mixer DAC code based on amplitudes of imaginary parts of a discrete Fourier transform (DFT) of captured data, where cross_val_I is a cross correlation between the reference signal and the real part of a received signal, cross_val_Q is a cross correlation between the reference signal and the imaginary part of the received signal, $\mu$ is a predetermined number; dac_code_acc_I is an accumulation for an I-mixer DAC code, dac_code_acc_Q is an accumulation for a Q-mixer DAC code, dac_code_I is a rounding of dac_code_acc_I, and where dac_code_Q is a rounding of dac_code_acc_Q, and where the rounding may be up or down; and
terminating processing if dac_code_acc_I and dac_code_acc_Q each converge, otherwise, updating dac_code_acc_I and dac_code_acc_Q, identifying a next data capture in the TX data capture buffer, and returning to generating, by the reference generator, the reference signal from the output of the TX data capture buffer.

19. The method of claim 16, further comprising, by the adaptive tuning module:
multiplying, by a first multiplier, a first input, a second input, and a third input;
adaptively updating, by an adaptive updating unit, an output of the first multiplier;
multiplying, by a second multiplier, an output of the adaptive updating unit and the predetermined step size for each of the I-mixer and the Q-mixer;
adding, by an adder, an output of the second multiplier and an output of an accumulator;
accumulating, by an accumulator, an output of the adder; and
rounding, by a rounding unit, an output of the accumulator.

20. The method of claim 17, further comprising:
mixing, by the I-mixer, a received sample and an I-mixer digital-to-analog (DAC) code;
mixing, by the Q-mixer, the received sample and a Q-mixer DAC code; and
removing, by a notch filter with a stopband around DC, DC from the reference signal.

* * * * *